Sept. 4, 1973 W. ECCLESTON ET AL 3,756,875

MAKING SEMICONDUCTOR DEVICES

Filed Aug. 26, 1971 2 Sheets-Sheet 1

MAKING SEMICONDUCTOR DEVICES

Filed Aug. 26, 1971 2 Sheets-Sheet 2

United States Patent Office 3,756,875

Patented Sept. 4, 1973

3,756,875

MAKING SEMICONDUCTOR DEVICES

William Eccleston, Bugbrooke, and Kenneth David Perkins, Wootton, England, assignors to Plessey Handel und Investments A.G., Zug, Switzerland Filed Aug. 26, 1971, Ser. No. 175,265
Claims priority, application Great Britain, Sept. 18, 1970, 44,547/70
Int. Cl. H01l 7/50
U.S. Cl. 156—11 3 Claims

ABSTRACT OF THE DISCLOSURE

A method of producing a semiconductive structure which includes the step of applying a liquid to a surface of the structure which has a contour having sharp surface irregularities, the liquid, on solidification, forming on the surface an electrically insulating solid film which is etchable and has a relatively smooth surface contour which is free from sharp surface irregularities. When the solid film is formed on the surface of a passivation layer and part of the surface of an underlying semiconductive layer which has a semiconductor junction therein that is covered by, and lies near to an edge of, the passivation layer, the method includes the step of etching the solid film to leave a fillet of the film material at the edge of the passivation layer. The fillet effectively stops the migration of surface species along the semiconductive-passivation layer interface. The liquid can be applied by a whirling or a dip-coating operation.

The invention relates to a method of producing a semiconductive structure.

In the fabrication of semiconductive structures by the well known "planar" integrated circuit process, the obtaining of an evenly distributed thin layer of a metal, a semiconductive material, or a dielectric material on a surface or surfaces of the semiconductive structure being fabricated is rendered difficult when the contour of the surface or surfaces being covered has sharp surface irregularities. These sharp surface irregularities are in the main constituted by the steep sided steps which are formed when the surface or surfaces are photo-engraved to produce say windows in an oxide layer or metal interconnection patterns.

Also, in the production of semiconductive structures which have a junction that is covered by, and lies near to an edge of, a passivation layer, it is, in practice, very difficult to effectively protect against the migration of surface species which will degrade the junction characteristics, along the semiconductor-passivation layer interface during subsequent process steps.

It is an object of the present invention to provide a method of producing a semiconductive structure wherein any sharp surface irregularities are effectively eliminated prior to the formation thereon of a layer of the desired material and wherein the semiconductor junction or junctions are more reliably protected during the production process.

The invention provides a method of producing a semiconductive structure including the step of applying a liquid to a surface of the structure which, on solidification, forms on the surface an electrically insulating solid film which is etchable and has a relatively smooth surface contour which is free from sharp surface irregularities.

According to a feature of the invention, a method as outlined in the preceding paragraph is provided wherein the solid film is formed on the surface of a passivation layer and part of the surface of an underlying semiconductive layer which has a semiconductor junction therein that is covered by, and lies near to an edge of, the passivation layer, the method including the step of etching the solid film to leave a fillet of the film material at the edge of the passivation layer.

Figure 1:
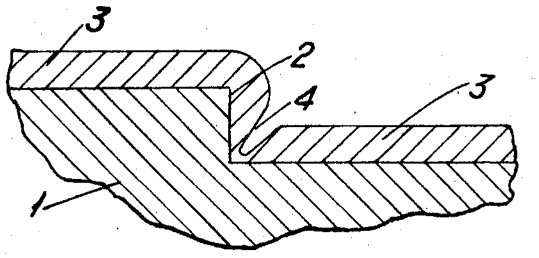
Figure 2:
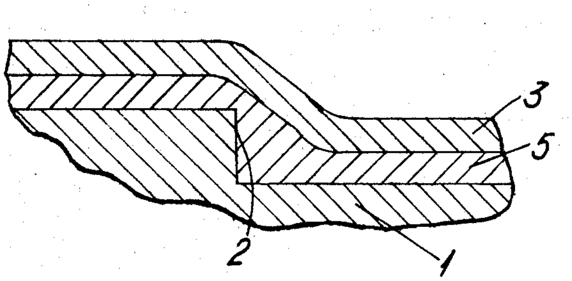
Figure 3:
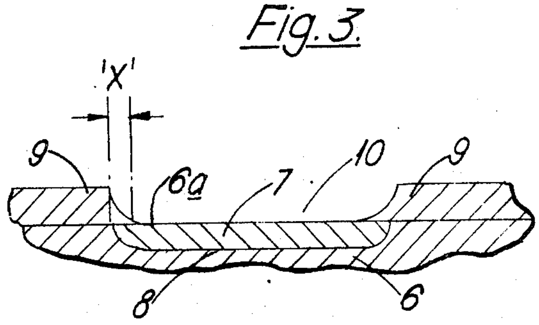
Figure 4:
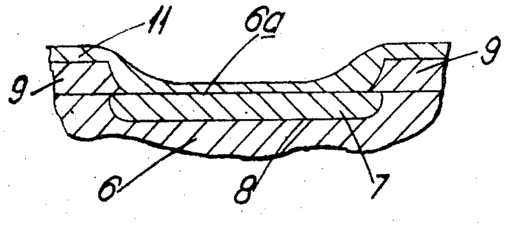
Figure 5:
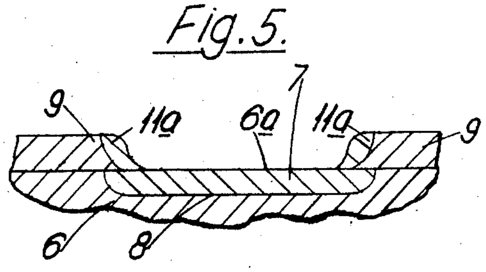

The foregoing and other features according to the invention will be better understood from the following description with reference to the accompanying drawings, in which:

FIG. 1 illustrates a cross-sectional side elevation of part of a semiconductive structure produced by a known method, FIG. 2 illustrates a cross-sectional side elevation of a semiconductive structure produced by the method according to the invention, FIG. 3 illustrates a cross-sectional side elevation of part of a shallow junction semiconductive structure, and FIGS. 4 and 5 illustrate cross-sectional side elevations of two stages of the method according to the invention when applied to the semiconductive structure of FIG. 3.

Referring to FIG. 1 of the drawings, part of a semiconductive structure is illustrated therein in a cross-sectional side elevation which includes a substrate 1 having a stepped upper surface as indicated by the sharp edged step 2. The upper surface of the substrate 1 is covered by a layer 3. The substrate 1 and the layer 3 can be of either a metal, a semiconductive material, or a dielectric material.

The layer 3 can be formed on the upper stepped surface of the substrate 1 by any known deposition technique, for example vacuum evaporation, or R.F. or D.C. sputtering. It is found, in practice, that coverage of the stepped surface of the substrate 1 by the known deposition techniques results in that part of the layer 3 in the region of the step 2 being non-uniform. This non-uniformity gives rise to the formation of a weak section in the layer, for example as indicated by the cavity 4, which will undoubtedly cause failure of a completed device or circuit arrangement during long term operation. In severe cases the surface contour of the layer 3 formed on the stepped surface of the substrate 1 can affect the satisfactory formation of additional layers since the cavitated surface results in poor coverage by the photoresist used in the photoengraving process steps which precede the formation of the additional layers. In extreme cases the surface contour of the layer 3 can be such that, after etching, voids are left at these weak points.

In the method according to the invention a film is formed on the stepped surface of the substrate 1, prior to the formation of the layer 3 in a manner such that it softens the edge of the step 2 and provides a surface contour that is more favourable to even coverage by a subsequently deposited layer 3.

The film is formed on the surface of the substrate 1 by applying a liquid, for example by a whirling or dip-coating operation, to the stepped surface and when the liquid solidifies it forms, as is illustrated in FIG. 2 of the drawings, a thin film 5 which provides a fillet in the bottom of the step 2 by what is believed to be a surface tension mechanism. The surface contour of the film 5 is now relatively smooth and free from sharp surface irregularities and, therefore, more favourable to even coverage by a subsequently deposited layer.

The liquid applied to the surface of the substrate 1 must be such that it forms, on solidification, an electrically insulating material which is etchable and compatible with integrated circuits, i.e., the liquid should be pure and free from trace elements. Typical liquids that can be utilised are lacquers, paints, plastics or epoxy resins.

Thus, after the formation of the film 5, the layer 3 can be formed by any conventional deposition technique and since the surface contour presented to the deposited material is now more favourable to even coverage, the surface contour of the film 5 will be relatively smooth and substantially free from sharp surface irregularities.

The method outlined in the preceding paragraph can also be utilised to give, during the production process, added protection to semiconductor junctions for example p-n junctions that lie near to the edge of say an oxide window that has been formed to facilitate the formation of an electrical contact for the structure. This situation occurs in shallow diffusion process, for example in the production of an "open emitter" structure.

FIG. 3 illustrates in a cross-sectional side elevation part of a shallow junction semiconductive structure which includes a semiconductive substrate 6 of one conductivity type, for example p-type, having a layer 7 of semiconductive material of the opposite conductivity type to the substrate 6, formed in the surface 6*a* thereof. The layer 7 and the substrate 6, therefore, define for the quoted example a p-n junction 8 which extends at each end to the surface 6*a* of the substrate 6. A passivation layer 9 formed on the surface 6*a* has a window 10 formed therein to facilitate the formation of an electrical contact on the exposed area of the layer 7.

The lateral displacement "*x*" of the point of emergence of the junction 8 from the edge of the window 10 is generally, in practice, not always large enough to afford effective reliable protection against migration of surface species which will degrade the junction characteristics, along the semiconductor-passivation layer interface during subsequent process steps. This situation can, as previously stated, arises in "open emitter" type structures where the oxide layer window that is provided for emitter diffusion is also used to facilitate the formation of the electrical contact for the emitter. With this arrangement the deposited electrical contact material, for example aluminium, fills the contact window and any slight migration of the contact material along the semiconductor-passivation layer interface, for example as occurs possibly during heat treatment, can cause a junction short circuit.

FIGS. 4 and 5 illustrate how the use of a surface film 11 formed on the surfaces of the layers 7 and 9 in a manner as previously outlined using a liquid, can, as will be subsequently outlined, give added protection to the junction during the production process. As illustrated in FIG. 4, the film 11 is formed by applying a liquid in a manner as previously outlined to the surface of the layers 7 and 9, and the liquid on solidification results in the formation of a fillet at each of the intersections of the passivation layer 9 and the surface 6*a*. The film 11 is then etched, for example by a dip-etch process, using an etch which does not attack the layers 7 and 9 to leave only the fillets 11*a* illustrated in FIG. 5. This is rendered possible because of the fact that the thickness of the film 11 is greater in the fillet area and, therefore, the fillets 11*a* will remain and effectively increase the lateral displacement "*x*." This process is self-aligning and requires no additional masks or photo-engraving stages.

It can, therefore, be seen from the foregoing that the method according to the invention provides a simple means of eliminating sharp surface irregularities in semiconductive structures thereby facilitating the carrying out of subsequent process steps and also provides more reliable junction protection in the production of shallow diffused semiconductive structures.

It is to be understood that the foregoing description of specific examples of this invention is made by way of example only and is not to be considered as a limitation in its scope.

What is claimed is:

1. A method of fabricating an open emitter type semiconductive structure comprising providing a semiconductive substrate of a first conductivity type having at least one window formed in a surface thereof, depositing a semiconductive material of a second conductivity type in said windowed portion of said substrate to thereby form a junction along the perimeter of said deposited layer-substrate interface, providing said substrate surface with a passivation layer having at least one window therein substantially coincidental with said windowed portion of said substrate, said passivation layer window being defined to have substantially sharp surface irregularities, coating at least said windowed portion of said structure with a hardenable liquid which is film forming and characterized by electrically insulating properties upon solidification thereon and treating said coating with an etchant which selectively etches said coating at a substantially uniform rate until said etchant etches substantially all said coating from said structure leaving a residual fillet of said coating along the perimeter of said passivation layer window, thereby contouring the surface of said structure and rendering the surface thereof free from sharp irregularities.

2. The method of claim 1 wherein said hardenable liquid is selected from the group consisting of lacquers, paints, plastics or epoxy resins.

3. The method of claim 1 further comprising depositing an electrical contact material in said window, migration of said contact material along junctions formed in said structures being inhibited by said fillet.

References Cited

UNITED STATES PATENTS

| | | | |
|---|---|---|---|
| 1,329,088 | 1/1920 | Leitner | 156—14 |
| 3,210,226 | 10/1965 | Young | 156—8 |
| 3,320,495 | 5,/1967 | Fox et al. | 317—234 |

JACOB H. STEINBERG, Primary Examiner

U.S. Cl. X.R.

156—11